United States Patent
Heigl

(10) Patent No.: US 6,844,718 B2
(45) Date of Patent: Jan. 18, 2005

(54) DOCKING DEVICE, MORE PARTICULARLY FOR A PROBE AND A TESTER

(76) Inventor: Helmuth Heigl, 83059 Anemoneweg 3a, Kolbermoor (DE)

( * ) Notice: Subject to any disclaimer, the term of this patent is extended or adjusted under 35 U.S.C. 154(b) by 443 days.

(21) Appl. No.: 10/138,619

(22) Filed: May 6, 2002

(65) Prior Publication Data

US 2002/0172579 A1 Nov. 21, 2002

(30) Foreign Application Priority Data

May 7, 2001 (DE) .......................................... 101 22 049

(51) Int. Cl.$^7$ ............................................. G01R 31/02
(52) U.S. Cl. .................................... 324/158.1; 324/758
(58) Field of Search ................................ 324/754, 758, 324/765, 158.1; 33/645; 73/866.5, 432.1

(56) References Cited

U.S. PATENT DOCUMENTS

| | | | | |
|---|---|---|---|---|
| 4,213,666 A | * | 7/1980 | Braginetz et al. ........... | 439/341 |
| 4,527,942 A | | 7/1985 | Smith | |
| 4,589,815 A | | 5/1986 | Smith | |
| 5,633,597 A | * | 5/1997 | Stowers et al. ............. | 324/761 |
| 5,923,180 A | * | 7/1999 | Botka et al. ................ | 324/758 |
| 6,114,869 A | * | 9/2000 | Williams et al. ........... | 324/765 |
| 6,747,447 B2 | * | 6/2004 | Markert et al. ........... | 324/158.1 |

FOREIGN PATENT DOCUMENTS

| | | |
|---|---|---|
| DE | 1527062 | 6/1969 |
| DE | 3626863 | 8/1987 |
| EP | 0237697 | 8/1983 |

OTHER PUBLICATIONS

Cover page of DE 3382731 (Jun. 19, 1994).

* cited by examiner

Primary Examiner—David Zarneke
Assistant Examiner—Russell M. Kobert
(74) Attorney, Agent, or Firm—Stevens, Davis, Miller & Mosher, LLP

(57) ABSTRACT

A device for docking two means (100, 200), more particularly a probe (100) and a tester (200), including a first mounting board (110) arranged at the first means (100) and a second mounting board (210) arranged at the second means (200) which in the docked condition of the means (100, 200) are adjoined in a docking plane, the first mounting board (110) being provided with a recess (111) oriented inclined to the docking plane for engaging at least one peg (220) shiftingly mounted on the second mounting board (210), the second mounting board (210) comprising an actuator (300) by means of which the peg (220) guided in the recess (111) is shiftable between an open position and a docked position mutually clamping the first mounting board (110) and the second mounting board (210), wherein the actuator (300) has a slide (310, 311) mounting the peg (220) which is movable by means of a spindle (330, 331) between the open position and the docked position of the peg (220) in order to achieve a compact design and relatively high docking forces.

21 Claims, 7 Drawing Sheets

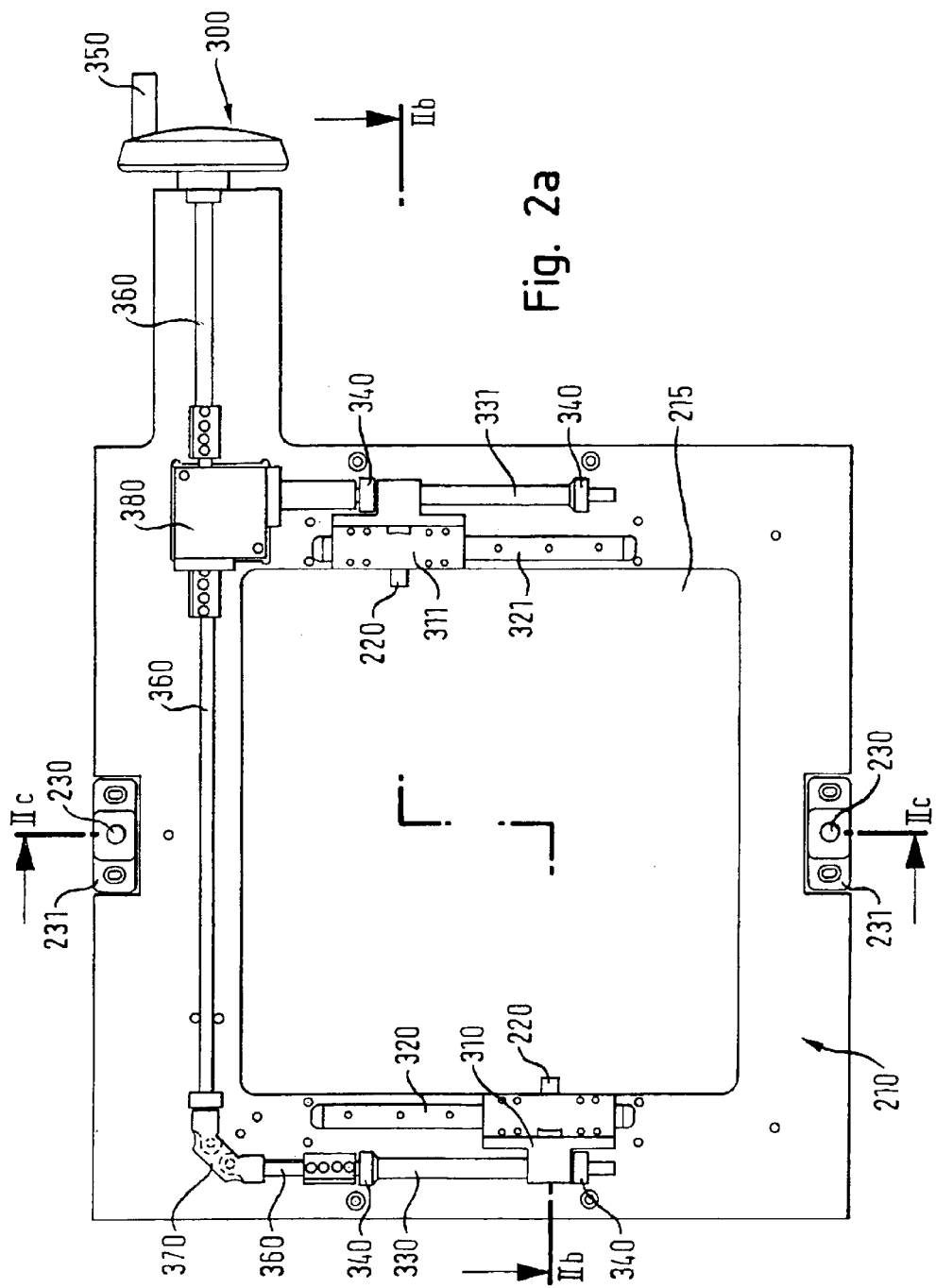

DOCKING DEVICE, MORE PARTICULARLY FOR A PROBE AND A TESTER

FIELD OF THE INVENTION

The present invention relates to a device for docking two means, more particularly a probe and a tester, including a first mounting board arranged at the first means and a second mounting board arranged at the second means which in the docked condition of the means are adjoined in a docking plane. The first mounting board is provided with a recess oriented inclined to the docking plane for engaging at least one peg shiftingly mounted on the second mounting board, and the second mounting board comprises an actuator by means of which the peg guided in the recess is shiftable between an open position and a docked position mutually clamping the first mounting board and the second mounting board.

BACKGROUND OF THE INVENTION

A device of the aforementioned kind finds application, for example, for docking a probe and a tester so that the probe is precisely positioned as a rule by a manipulator on the tester. The tester involved may be, for example, a system for grading integrated circuits (ICs) or wafers for function testing by the probe. To obtain true results it is necessary to advance the relatively heavy probe very near to the tester and to maintain it precisely in position there.

Known devices of this kind include a first mounting board arranged at the first means and a second mounting board arranged at the second means which in the docked condition of the means adjoin each other in a docking plane. The first mounting board is provided with a recess oriented inclined to the docking plane for engaging at least one peg shiftingly mounted on the second mounting board. The peg is shiftable between an open position and a docked position in the substantially groove-like recess. When docking the probe to the tester the peg in its open position gains access to the recess. With the aid of an actuator the peg can then be shifted into the docked position. Due to the recess being oriented inclined to the docking plane the first and second mounting board are mutually clamped when the peg is shifted from the open position into the docked position. To reliably clamp the first mounting board and the second mounting board, it is then necessary to apply relatively high docking forces by the actuator.

Known devices of the aforementioned kind are provided with an actuator including a lever-actuated rod gearing comprising a plurality of articulatedly interconnected push rods. The peg engaging the recess in the first mounting board is connected to the push rods so that when the push rods are moved by the lever the peg is moved from its open position into the docked position and vice-versa. Also known, instead of this mechanical rod actuator, is to provide a hydraulic or pneumatic actuator for shifting the peg between the open position and docked position.

The disadvantage of these known devices is the relatively bulky design of the actuator which is particularly unfavorable in conjunction with IC and wafer probe/tester docking as described above which usually takes place in a clean room or ultraclean environment. In addition, refitting the known devices with various push rods is relatively complicated. Also unsatisfactory is that due to the lever being actuated manually as a rule, it is not always the case that the docking forces are sufficient.

SUMMARY OF THE INVENTION

The present invention is based on the objective of providing a device for docking two means with which relatively high docking forces are achievable for a compact design.

To achieve this objective it is provided for in the device having the aforementioned features in accordance with the invention that the actuator has a slide mounting the peg which is movable by means of a spindle between the open position and the docked position of the peg.

Such an actuator makes use of having discovered that by means of the spindle-powered slide mounting the pin, relatively high docking forces can now be achieved. The reason for this is that unlike conventional push rods transmitting tensioning and compressive forces, the spindle permits transmission of a torque with which far higher docking forces can be produced. Transmitting a torque instead of tensioning and compressive forces further permits achieving a relatively compact design of the actuator. In addition, providing the slide powered by the spindle facilitates orienting the peg relative to the recess configured in the first mounting board. This is condusive to adapting the device in accordance with the invention flexibly to a variety of first mounting boards and thus to various probes.

Advantageous aspects of the device in accordance with the invention read from the subject matter of the dependent claims.

Thus, it is of advantage as regards shifting the peg into the recess with low friction as mandatory with use in a clean room environment, to arrange the peg mounted rotatable about its longitudinal axis on the slide. This enables the peg to rotate about its longitudinal axis in being shifted from the open position into the docked position in thus practically avoiding any attrition formed by friction between the peg and the recess.

It is further of advantage to provide two pegs on the slide arranged preferably adjacently staggered inclined in accordance with the orientation of the recess. Providing two pegs permits achieving high docking forces for a relatively compact design.

Preferably the recess is configured in a sidewall of the first mounting board facing the peg in the docked condition of the means and extending in the open position of the peg down to an underside of the first mounting board facing the second mounting board. This configuration results in the peg engaging the recess parallel to the docking plane and thus perpendicular to the direction in which the first mounting board and the second mounting board are joined together. Reliably clamping the first mounting board and second mounting board in the docked position of the peg is thereby assured.

Advantageously, the second mounting board is provided with a guide for the slide to ensure precisely shifting of the peg. As regards a configuration which is simple and has a proven record of success the guide in this arrangement is configured flat or dovetailed.

It is further of advantage to arrange at least two bearings in which the spindle is rotatively mounted on the second mounting board in thus making sure that on rotation of the spindle the slide moves relative thereto.

In one advantageous aspect the spindle is provided with a self-locking thread to prevent the peg from automatically retracting into the open position from its docked position. The self-locking thread of the spindle also makes it possible to vary defining the docked position of the peg. For in this aspect it is not necessary to provide an end stop for the peg in the docked position. Instead, the docked position can then be defined, for instance, by a predefined docking force being attained.

To make for a configuration which is simple and has a proven record of success the spindle can be powered to advantage by a drive moment produced by a handwheel or an electric motor. When an electric motor is used, docking the first mounting board and second mounting board can be automated by simple ways and means. Preferably the drive moment is transmitted to the spindle by means of at least one connecting shaft, this aspect assuring an arrangement of the spindle on the second mounting board in keeping with individual requirements, i.e. irrespective of the source generating the drive moment, for example the handwheel. For this purpose it is also of advantage when two connecting shafts and/or a connecting shaft and the spindle are interconnected by an articulated coupling, preferably a universal joint.

In one advantageous further embodiment of the device in accordance with the invention it is also proposed to provide several slides on the second mounting board. In this case the drive moment can be transmitted by means of an angular gearing preferably configured as a bevel gearing or spiral gearing simultaneously to several spindles driving each of the slides, the first mounting board then being provided with recesses at positions corresponding to the individual slides. Providing several slides and consequently several pegs engaging a recess in differing positions makes it possible to uniformly distribute the docking forces along the periphery of the first mounting board and second mounting board. In this arrangement good results have been obtained by arranging the slides in pairs opposingly on the second mounting board. To ensure safe docking of the first mounting board and second mounting board it is of advantage in this case to travel the opposing slides in opposite directions, the recesses in the first mounting board corresponding to the slide in each case being configured to travel opposingly. For it is in this way that a diametral arrangement of the docked and open positions of the pegs materializes.

In accordance with a preferred aspect of the device in accordance with the invention the spindles assigned to the slides arranged opposingly are provided with threads differently oriented. Providing one spindle with a right-hand thread and another spindle with a left-hand thread permits an opposite motion of each slide for the same sense of rotation of the spindles.

In a further advantageous further embodiment of the device in accordance with the invention it is further proposed to provide the second mounting board with a centering pin for engaging a correspondingly configured opening in the first mounting board in the docked condition of the means. Centering the first mounting board and second mounting board in this way ensures that the peg is able to engage the recess of the first mounting board in its open position. In conclusion it is proposed to configure the opening as a sleeve receiving the centering pin to reliably attain centering in a low-profile configuration of the first mounting board.

BRIEF DESCRIPTION OF THE DRAWINGS

Details and further advantages of the present invention will now be described by way of a preferred example embodiment as shown in the drawing diagramatically in which:

FIG. 2a is a plan view of the second mounting board including an actuator mounted thereon;

FIG. 2b is a section taken along the line IIb—IIb in FIG. 2a;

FIG. 2c is a section taken along the line IIc—IIc in FIG. 2a;

FIG. 3b is a section taken along the line IIIb—IIIb in FIG. 3a;

FIG. 3d is a section taken along the line IIId—IIId in FIG. 3a;

DETAILED DESCRIPTION OF THE PREFERRED EMBODIMENTS

Figure 1A:
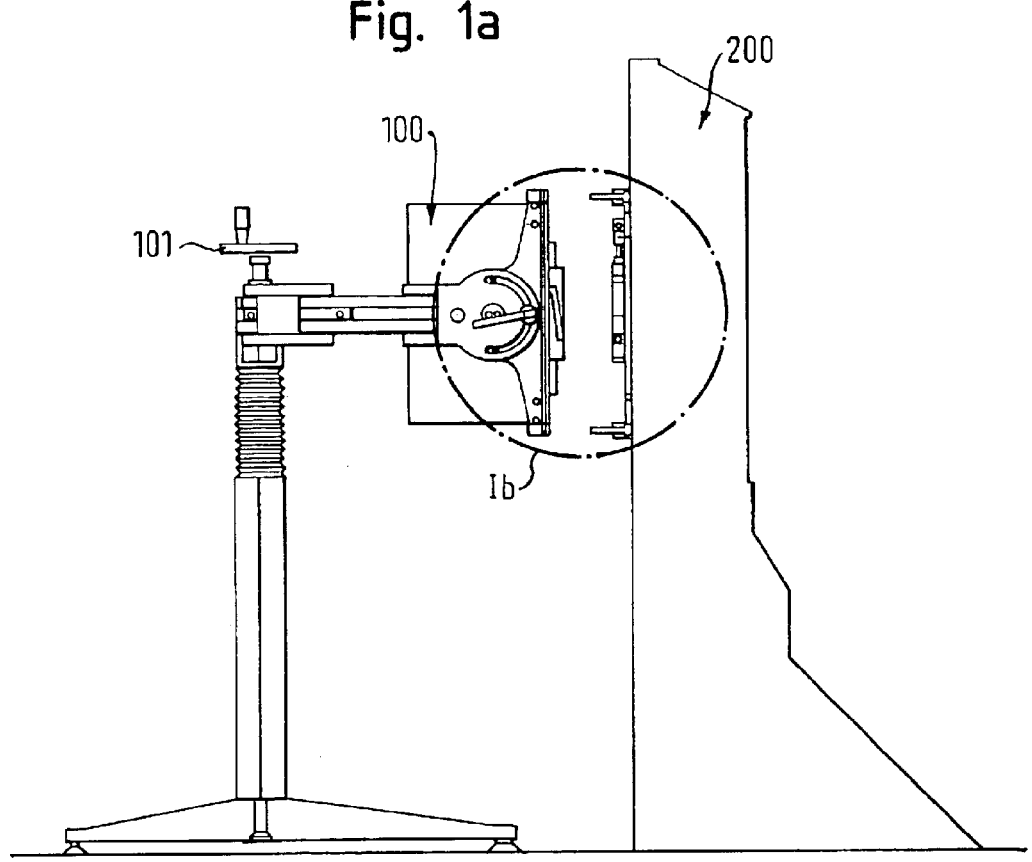
FIG. 1a is a side view of the device in accordance with the invention for docking a probe to a tester.
Figure 1B:
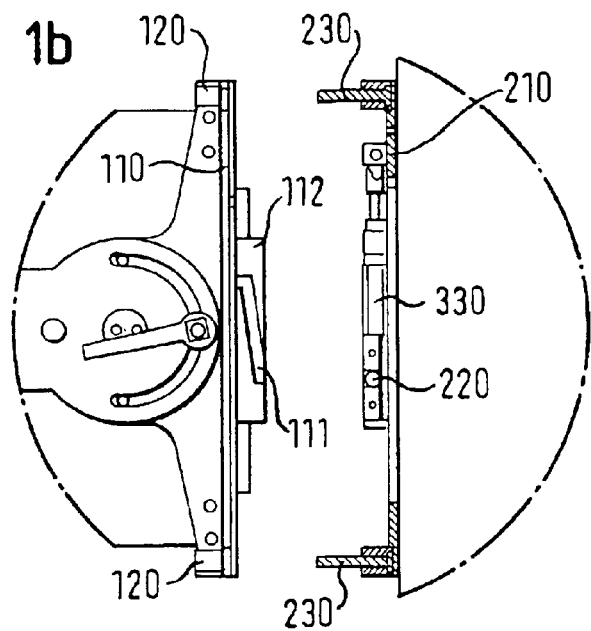
FIG. 1b is a view on a magnified scale of the detail identified 1b in FIG. 1a showing a first mounting board and a second mounting board.
Figure 1C:
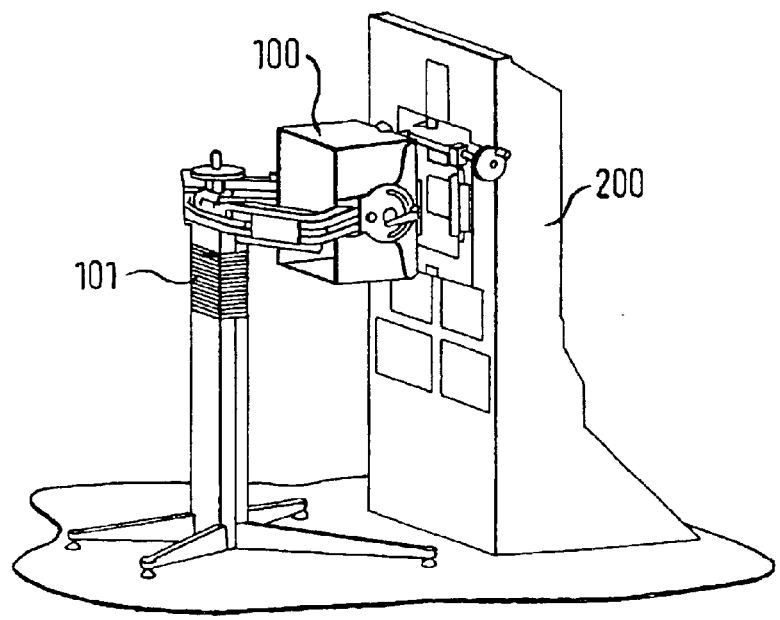
FIG. 1c is a view of the probe to be docked to the tester.
Figure 2B:
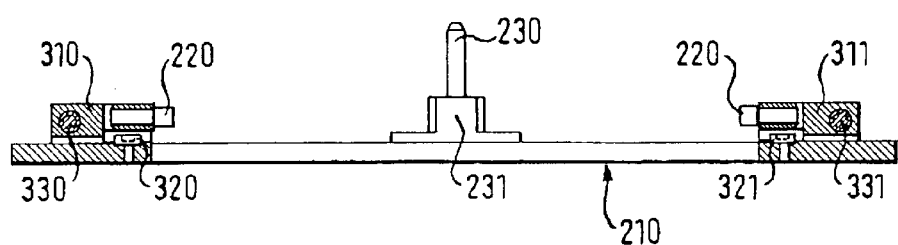
Figure 2C:
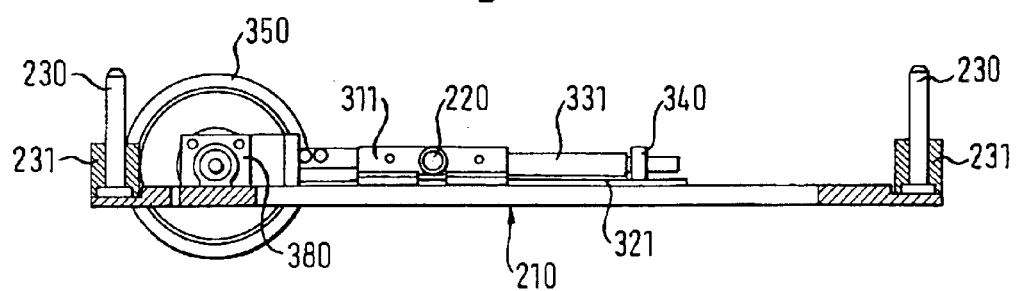

Referring now to FIGS. 1a to 1c there is illustrated a probe 100 which is freely positionable in space by means of a manipulator 101. The probe 100 in the position as shown in FIGS. 1a to 1c is still to be docked to a tester 200. The probe 100 serves to function-test integrated circuits (ICs) or wafer furnished by the tester 200. Arranged on the probe 100 or alternatively on the tester 200 is a first mounting board 110. Provided on the tester 200 or alternatively on the probe 100 is a second mounting board 210 shown in more detail in FIGS. 2a to 2c. This second mounting board 210 adjoins the first mounting board 110 when the probe 100 is docked on the tester 200.

Referring now to FIG. 2a there is illustrated how the substantially square second mounting board 210 features a center opening 215 in the middle. Mounted on this frame formed in this way is an actuator 300. The actuator 300 consists of a handwheel 350 which is non-rotatably connected by a connecting shaft 360 to an angular gearing 380 configured as a spiral gearing.

Arranged on both sides of the center opening 215 are two slides 310, 311 arranged opposite each other. The slides 310, 311 are guided linearly and parallel to each other by a guide 320, 321 configured dovetailed. As particularly evident from FIGS. 2b and 2c the slides 310, 311 are each moved by a spindle 330, 331. The spindle 331 is directly connected to the angular gearing 380 whereas the spindle 330 arranged more remote from the angular gearing 380 is connected to the angular gearing 380 via an articulated coupling 370 configured as a universal joint and a connecting shaft 360. Each spindle 330, 331 is mounted in a plain bearing 340 and features a differing orientation of its thread configured self-locking. This results in each slide 310, 311 being moved in the opposite direction to the other for the same sense of rotation of the spindle 330, 331 powered by the handwheel 350.

Each slide 310, 311 is provided with a peg 220. The pegs 220 are arranged rotatively mounted on the slides 310, 311 and protrude each partly into the portion of the center opening 215 in opposite directions.

Also arranged on the second mounting board 210 are two centering pins 230. The centering pins 230 are secured to bases 231 arranged on both sides of the center opening 215 and protrude upright from the plane of the second mounting board 210.

In the docked condition of probe 100 and tester 200 the centering pins 230 serve to center the first mounting board 110 and second mounting board 210 relative to each other. For this purpose, the first mounting board 110 likewise configured substantially square and provided with a center opening 115 in the middle is provided with two sleeves 120 arranged on both sides of the center opening 115 in which the centering pins 230 engage with the first mounting board 110 adjoining the second mounting board 210. As evident from FIGS. 1b and 3a to 3d the first mounting board 110 is provided on both sides of the center opening 115 with a sidewall 112 protruding downwards and extending along the slides 310, 311. The face 113 of the sidewalls 112 facing the slides 310, 311 is provided with a recess 111 open in the direction of the slides 310, 311 in which each peg 220 engages.

Figure 4C:
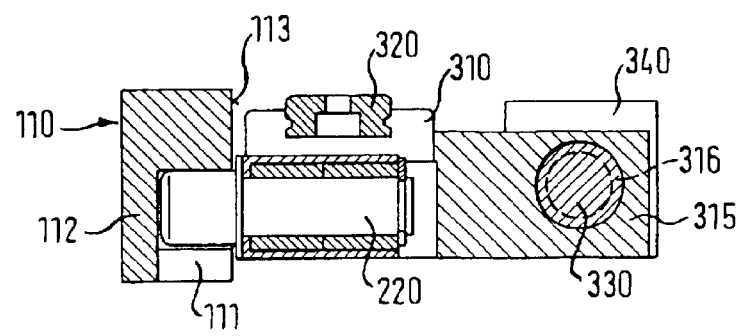
FIG. 4c is a section taken along the line IVc—IVc in FIG. 4b.
Figure 4A:
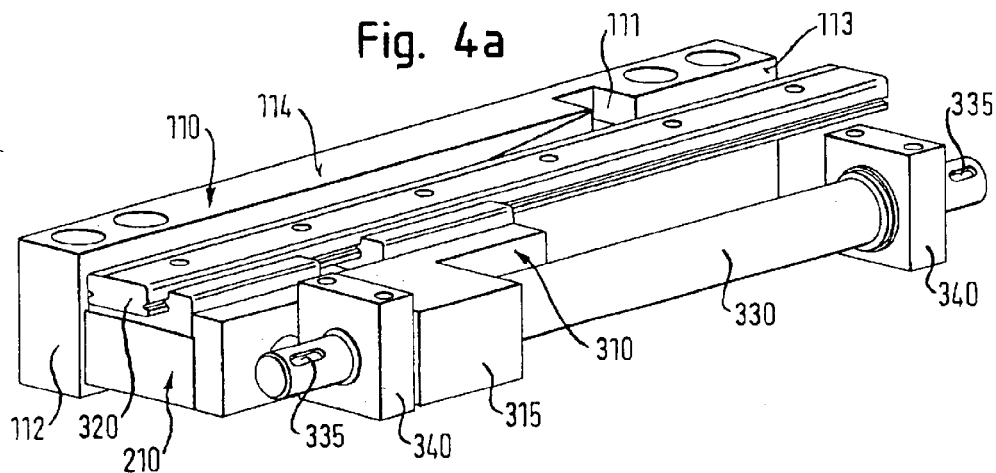
FIG. 4a is a view in perspective of a slide powered by means of a spindle and linearly shiftable by a guide.
Figure 4B:
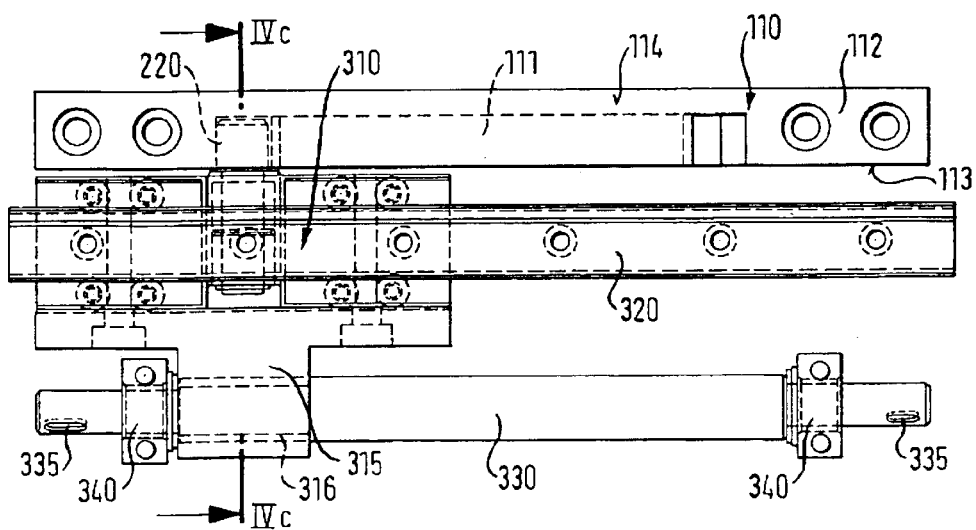
FIG. 4b is a plan view of the slide as shown in FIG. 4b.

Referring now to FIGS. 4a to 4c in addition to FIG. 1a there is illustrated how the recess 111 is configured oriented inclined to the plane of the first mounting board 110 and second mounting board 210 in porting into the open at the underside 114 of the sidewall 112. This makes it possible to adjoin the first mounting board 110 and second mounting board 210 so closely in docking the probe 100 to the tester 200 that the pegs 220 are guided into each recess 111 from the underside 114 of the sidewall 112.

Figure 3A:
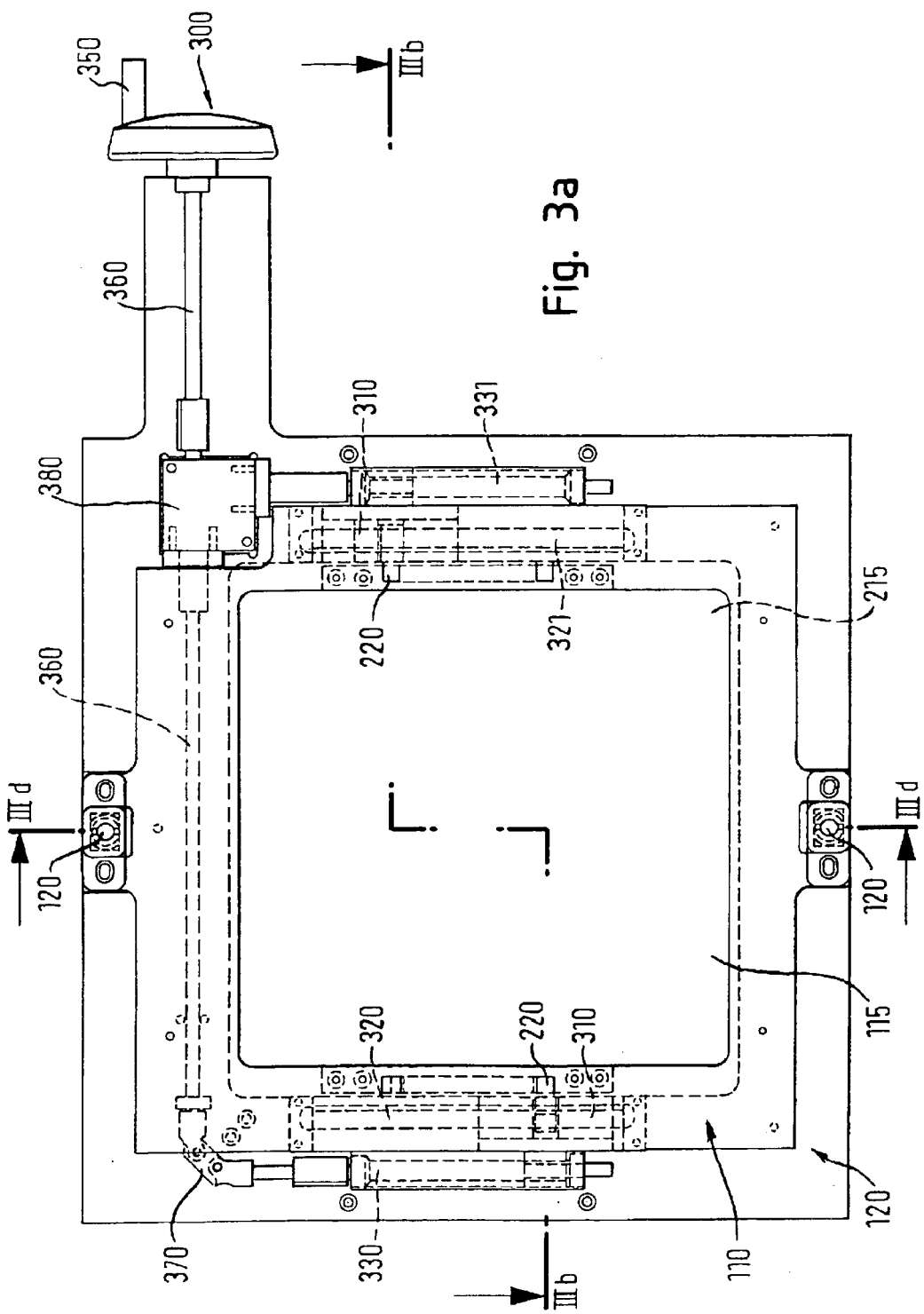
FIG. 3a is a plan view as shown in FIG. 2a with the first mounting board adjoining the second mounting board.
Figure 3B:
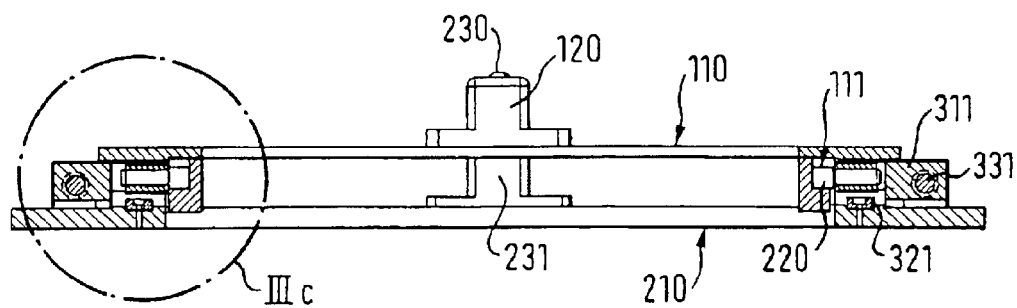
Figure 3C:
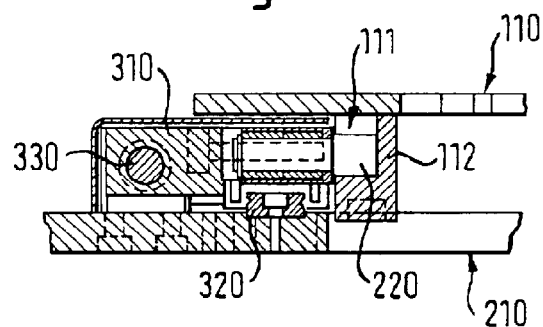
FIG. 3c is a view on a magnified scale of the detail identified IIIc in FIG. 3b.
Figure 3D:
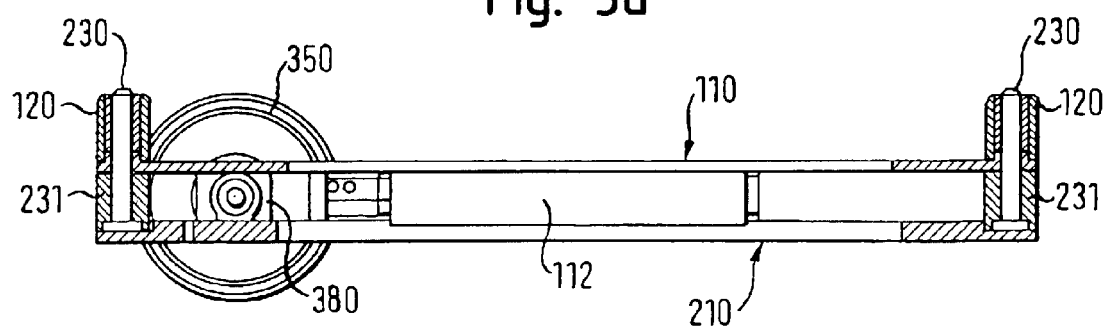

As evident from FIG. 3a the recesses 111 are configured opposing in accordance with the opposing directions of travelling the slides 310, 311 in thus resulting in open or docked positions of the pegs 220 which are diametrally opposed. The open position of the pegs 220 is located where the recesses 111 port into the open at the underside 114 of the sidewalls 112, whereas the docked position is located at the end of the recess 111 facing away from the open position. This is clearly evident from FIG. 4b. Likewise evident from the last-mentioned Figure is how slide 310 and analog slide 311 is provided in a section 315 comprising spindle 330 and 331 respectively with a female thread 316. It is due to the female thread 316 that rotation of the spindles 330, 331 produces a relative movement between these and the slides 310, 311. FIGS. 4a and 4b show in addition how spindle 330 and analog spindle 311 is provided with grooves 335 at their ends in each case by means of which, for instance, a connecting shaft 360 or articulated coupling 370 can be non-rotatably connected.

With the device as described above for docking the probe 100 at the tester 200 it is now possible to achieve relatively high docking forces for a compact design. The reason for this is that the slides 310, 311 powered to travel by the spindles 330, 331 and linearly guided by means of the guides 320, 321 and thus the pegs 220 are moved from the open position into the docked position. In moving the peg 220 from the open position into the docked position the first mounting board 110 and the second mounting board 210 are mutually clamped by the angled orientation of the recesses 111. The torque transmitted from the handwheel 350 to the spindles 330, 331 is converted into a linear movement of the slides 310, 311, resulting in high docking forces in clamping the first mounting board 110 to the second mounting board 210. Shifting the pegs 220 by means of the slides 310, 311 powered by the spindles 330, 331 also contributes towards making the device as described above universal in application, it thus being possible, for example, to dimension the length of the spindles 330, 331 so that an adequate travel of the slides 310, 311 is available for various probes 100 and thus for first mounting board 110 having recesses 111 differing in length. In addition, simply connecting the spindles 330, 331 by connecting shafts 360 and/or articulated couplings 370 and/or angular gearings 380 makes for a flexible configuration of the device which is simple to adapt to each application. Last but not least, providing the spindles 330, 331 with a self-locking thread reliably ensures precise shifting of the pegs 220 into the docked position.

What is claimed is:

1. A device for docking two means, said device comprising a first mounting board arranged at the first means and a second mounting board arranged at the second means which in the docked condition of the means are adjoined in a docking plane, the first mounting board being provided with a recess oriented inclined to the docking plane for engaging at least one peg shiftingly mounted on the second mounting board, the second mounting board comprising an actuator by means of which the peg guided in the recess is shiftable between an open position and a docked position mutually clamping the first mounting board and the second mounting board, the actuator having a slide mounting the peg which is movable by means of a spindle between the open position and the docked position of the peg.

2. The device as set forth in claim 1, wherein the peg is mounted rotatable about its longitudinal axis on the slide.

3. The device as set forth in claim 1, wherein two pegs are provided on the slide.

4. The device as set forth in claim 1, wherein the recess is configured in a sidewall of the first mounting board facing the peg in the docked condition of the means and extending in the open position of the peg down to an underside of the first mounting board facing the second mounting board.

5. The device as set forth in claim 1, wherein the second mounting board is provided with a guide for the slide.

6. The device as set forth in in claim 5, wherein the guide is configured flat or dovetailed.

7. The device as set forth in claim 1, wherein at least two bearings in which the spindle is rotatively mounted are arranged on the second mounting board.

8. The device as set forth in claim 1, wherein the spindle is provided with a self-locking thread.

9. The device as set forth in claim 1, wherein the spindle can be powered by a drive moment produced by a handwheel or an electric motor.

10. The device as set forth in claim 9, wherein the drive moment is transmitted to the spindle by means of at least one connecting shaft.

11. The device as set forth in claim 10, wherein two connecting shafts and/or a connecting shaft and the spindle are interconnected by an articulated coupling.

12. The device as set forth in claim 10, wherein two connecting shafts and/or a connecting shaft and the spindle are interconnected by a universal joint.

13. The device as set forth in claim 9, wherein several slides are provided on the second mounting board, the drive moment being transmitted by means of an angular gearing simultaneously to several spindles driving each of the slides, the first mounting board being provided with recesses at positions corresponding to the individual slides.

14. The device as set forth in claim 13, wherein the slides are arranged in opposing pairs on the second mounting board.

15. The device as set forth in claim 14, wherein the opposing slides can be travelled in opposite directions, the recesses in the first mounting board corresponding to the slide in each case being configured to travel opposingly.

16. The device as set forth in claim 14, wherein the spindles assigned to the slides arranged opposingly are provided with threads differently oriented.

17. The device as set forth in claim 9, wherein several slides are provided on the second mounting board, the drive moment being transmitted by means of an angular gearing, selected from the group consisting of a bevel gearing and spiral gearing, simultaneously to several spindles driving each of the slides, the first mounting board being provided with recesses at positions corresponding to the individual slides.

18. The device as set forth in claim 1, wherein the second mounting board is provided with a centering pin for engaging an opening correspondingly configured on the first mounting board in the docked condition of the means.

19. The device as set forth in claim 18, wherein the opening is configured as a sleeve receiving the centering pin.

20. The device as set forth in claim 1, wherein the two means comprise a probe and a tester, respectively.

21. The device as set forth in claim 1, wherein two pegs are provided on the slide arranged adjacently staggered inclined in accordance with the orientation of the recess.

* * * * *